United States Patent [19]
Lee et al.

[11] Patent Number: 6,162,671
[45] Date of Patent: Dec. 19, 2000

[54] METHOD OF FORMING CAPACITORS HAVING HIGH DIELECTRIC CONSTANT MATERIAL

[75] Inventors: Moon-Hee Lee, Suwon; Jae-Inh Song; Kyu-Hwan Chang, both of Kyunggi-do; Chang-Lyong Song, Suwon, all of Rep. of Korea

[73] Assignee: Samsung Electronics, Co., Ltd., Suwon, Rep. of Korea

[21] Appl. No.: 09/206,813

[22] Filed: Dec. 7, 1998

[30] Foreign Application Priority Data

Dec. 6, 1997 [KR] Rep. of Korea ............ 97-66533
Jul. 23, 1998 [KR] Rep. of Korea ............ 98-29731

[51] Int. Cl.⁷ ............................................. H01L 21/8234
[52] U.S. Cl. .................. 438/238; 438/240; 437/60; 361/321.4
[58] Field of Search ................... 438/238, 240; 437/60; 361/321.4

[56] References Cited

U.S. PATENT DOCUMENTS

| | | | |
|---|---|---|---|
| 5,506,166 | 4/1996 | Sandhu et al. | 437/60 |
| 5,559,666 | 9/1996 | Figura et al. | 361/321.4 |
| 5,808,854 | 9/1998 | Figura et al. | 361/321.4 |
| 6,017,789 | 1/2000 | Sandhu et al. | 438/240 |

*Primary Examiner*—Richard Elms
*Assistant Examiner*—Pho Luu
*Attorney, Agent, or Firm*—Marger Johnson & McCollom, P.C.

[57] ABSTRACT

Disclosed is a method of forming storage cell capacitors for use in dynamic random access memories, which comprises, after sequentially depositing a reaction barrier layer and a platinum layer on top of a contact plug which formed on a semiconductor substrate having a node, wet etching the reaction barrier layer to form lateral recesses underneath edges of the platinum layer, and forming sidewall spacer in the lateral recesses and underneath the platinum layer. Also, according to an another embodiment of the invention, a method comprise two important features, one is to surround sidewalls of a reaction barrier layer with an oxide layer, and the other is to form a platinum layer, serving as a storage node electrode of a capacitor, having an inclined plane of more than 80 degrees. The upper portion of the platinum layer has a steeply-sloped pattern of more than 80° inclination angle by two continuous etching steps, one is a dry etch for partially etching the upper portion of the platinum layer and the other is a wet etch for etching the rest of the upper portion thereof.

13 Claims, 12 Drawing Sheets

METHOD OF FORMING CAPACITORS HAVING HIGH DIELECTRIC CONSTANT MATERIAL

FIELD OF THE INVENTION

The present invention relates to semiconductor fabrication technology, and more particularly to a method of forming storage cell capacitors for use in dynamic random access memories.

BACKGROUND OF THE INVENTION

As memory devices become highly integrated, it is necessary to decrease the size of circuit components. One way to retain the storage capacity of a dynamic random access memory (DRAM) device and decrease its size is to increase the dielectric constant of the dielectric layer of the storage cell capacitor. In order to achieve the charge storage efficiency needed in 256 megabit(Mb) memories and above, materials having a high dielectric constant, typically greater than 50, can be used as the dielectric layer between the storage node electrode (a lower capacitor electrode) and the cell plate capacitor electrode (an upper capacitor electrode). The dielectric constant is a value characteristic of a material and is proportional to the amount of charge that can be stored in the material when it is interposed between two electrodes. Among several high dielectric constant materials, particularly, (Ba, Sr)TiO$_3$ [BST] material is mainly used in highly integrated semiconductor circuit devices. Since the BST film has a high dielectric constant between about 200 and 300 in accordance with its fabricating process, capacitors using the BST film can respectively obtain a desired capacitance value.

Unfortunately, the BST material is incompatible with existing processes and can not be simply deposited on a polysilicon electrode, unlike the other dielectric materials, such as Si$_3$N$_4$ and SiO$_2$/Si$_3$N$_4$ composite layers. This incompatibility is a result of the O$_2$ rich ambient present during the high dielectric constant material deposition or during annealing steps. The O$_2$ oxidizes portions of the materials formerly used for the storage node plate. Also, the capacitors employing BST undergo physical degradation during thermal cycles due to the diffusion of the cell plate material into the dielectric.

In the storage cell capacitor incorporating BST, some of these problems are resolved. The storage node electrode typically comprises a layer of platinum overlying a reaction barrier layer which, in turn, overlies a polysilicon plug. Platinum is used as the upper portion of the first electrode since it will not oxidize during a BST deposition or subsequent annealing steps. An electrode that oxidizes would have a low dielectric constant film below the BST, thereby negating the advantages provided by the high dielectric constant material. The reaction barrier layer, e.g., constructed of titanium nitride or tantalum is introduced to avoid Si and Pt inter-diffusion and to prevent the formation of SiO$_2$ on top of the platinum surface. In addition, the reaction barrier layer protects the top surface thereof from strong oxidizing conditions during the BST deposition. FIG. 1 depicts the stacked storage node electrode of the related art comprising reaction barrier layer 1, platinum storage node electrode 2 (Ta/Pt) overlying the polysilicon plug 3.

However, the sidewalls 4 of the reaction barrier layer 1 formed during this process are subject to oxidation during the subsequent deposition of the BST layer (not shown in FIG. 1). Since the reaction barrier layer 1 oxidizes, the polysilicon plug 3 is also susceptible to oxidation. When portions of the polysilicon plug 3 and the material of the reaction barrier layer 1 are oxidized, the capacitance of the storage cell capacitor is decreased since the storage node electrode is partially covered by a low dielectric constant film formed due to the partial oxidation of the storage node electrode. This capacitance reduction leads to increase in leakage current.

In addition, during the high dielectric constant material deposition or during annealing steps, O$_2$ is penetrated into the platinum storage node electrode 2 through grain boundaries thereof, thereby oxidizing the surface of the polysilicon plug 3, and the platinum itself reacts to the polysilicon, thereby forming a silicide composite film therebetween.

Furthermore, the storage node contact resistance increases drastically between the polysilicon plug 3 and the reaction barrier layer 1 as a result of degradation of the reaction barrier layer during deposition of BST and other high dielectric constant materials.

Subsequently, as shown in FIG. 1B, a thin film 6 of BST material is provided over the platinum layer 2, and finally the cell plate capacitor electrode serving as an upper capacitor electrode 7 is formed on the BST film 6. As a result, the prior art storage cell capacitor is completed.

An ideal capacitor construction is illustrated in FIG. 1B, although such construction may not practically occur during the fabrication of a capacitor. Specifically, with reference to FIG. 1C, the sidewalls 4 of the reaction barrier layer 1 is oxidized, thereby resulting in formation of a wedge-shaped oxide layer 8. This actually creates stresses and cracks where the wedge-shaped oxide layer 8, as shown in FIG. 1C, is formed.

Thus, the process for minimizing partial oxidation of a reaction barrier layer and decreasing contact resistance between a polysilicon plug and the reaction barrier layer is disclosed in U.S. Pat. No. 5,381,302. In this process, as shown in FIG. 2, the storage cell capacitor features a storage node electrode having a reaction barrier layer which prohibits diffusion of atoms. The reaction barrier layer may be titanium nitride or another material which prohibits silicon diffusion. The reaction barrier layer is interposed between a conductive plug 13 and a non-oxidizing conductive material 12 such as platinum. A dielectric layer 17, typically BST, is deposited on the non-oxidizing material 12. The reaction barrier layer is surrounded on its sides by an insulating layer 15. The reaction barrier layer is comprised of two layers: a first barrier layer 16 such as titanium silicide and a second barrier layer 11 such as titanium nitride.

The prior art capacitor forming method illustrated in FIG. 2 can prevent a wedge-shaped oxide layer from being formed as shown in FIG. 1C during the deposition of BST or subsequent annealing steps, but has still another problem. Since the platinum layer 12 is patterned only by a dry etching process using an electrode forming mask while etched, the method illustrated in FIG. 2 as well as the method illustrated in FIGS. 1A to 1C can not be applicable to fabrication of semiconductor memory devices with small design rule, i.e., high integration degree. This method of forming platinum capacitor electrode is illustrated in FIGS. 3A to 3C.

Referring to FIG. 3A, a layer 23 of, for example, TiN material is provided over a conductive plug 21 which is defined by an insulating layer 22 on a semiconductor substrate 20. A platinum layer 24 is provided over the TiN layer 23, which serves as a reaction barrier layer, and then photoresist mask 26 is provided on the platinum layer 24 so as to form a lower capacitor electrode. Subsequently, when a dry etching process using the mask 26 is carried out to achieve the platinum layer patterns 24, part of sputtered platinum particles 28 is adhered to sidewalls of the mask 26, and thereby the mask 26 has a profile shown in FIG. 3B. As is apparent from FIG. 3B, since the sputtered platinum particles 28 adhere more to the lower portions of the mask sidewalls than to the upper portions thereof, the bottom portion of the mask 26 becomes wider. The dry etching process using the mask whose bottom portion is wider continues to be carried out to form platinum patterns having slackly inclined plans as shown in FIG. 3C.

As described above, when the prior art method of forming capacitors is applied to highly integrated semiconductor memory devices, there arises a need for a method of insuring that the platinum patterns are electrically separated from one another.

SUMMARY OF THE INVENTION

It is therefore an object of the invention to provide a method of forming a storage cell capacitor whose reaction barrier layer has opposing lateral recesses beneath a storage node electrode of the capacitor, and in which an oxidation barrier material layer is formed on both of the opposing lateral recesses so as to prevent the storage node electrode from being oxidized during a BST deposition or a subsequent anneal.

It is a further object of the invention to provide a method of forming a storage cell capacitor in which a storage node electrode of platinum is formed in a damascene process well-known in this art, part of the platinum electrode is dry etched using a electrode forming mask and the remain thereof is wet etched using the electrode forming mask whose bottom portion is more wide by sticking platinum particles sputtered during the dry etching process.

It is another object of the invention to provide a method of forming a storage cell capacitor whose storage node electrode has a steeply-sloped pattern.

It is an additional object of the invention to provide a method of forming a storage cell capacitor which is particularly suitable to semiconductor devices with high integration degree.

It is another object of the invention to provide a method of forming a storage cell capacitor having a storage node electrode which comprises a platinum plate with a slackly inclined plane and a reaction barrier layer resistant to oxidation during deposition of a high dielectric material or subsequent anneal steps.

According to one aspect of the present invention, a method of forming a storage cell capacitor on a substrate having a node, comprises the steps of forming a reaction barrier layer over the node; forming a conductive layer over the reaction barrier layer; sequentially dry etching the conductive layer and the reaction barrier layer to form a storage node electrode; wet etching the reaction barrier layer to form lateral sides of the reaction barrier layer; forming an oxidation barrier layer over the platinum layer including the reaction barrier layer; and dry etching the oxidation barrier layer to form an oxidation barrier spacer on the lateral sides of the reaction barrier layer and beneath the platinum layer. The wet etching step is performed using a chemical which includes $H_2O_2$, HF and deionized water, or a chemical which includes $H_2O_2$, $NH_4OH$ and deionized water.

According to another aspect of the present invention, a method of forming a storage cell capacitor on a substrate having a node, comprises the steps of forming a reaction barrier layer over the node; forming a storage node electrode over the reaction barrier layer; forming recesses at both sidewalls of the reaction barrier layer and beneath the storage node electrode; and forming an oxidation barrier spacer on the recesses.

According to an additional aspect of the present invention, a method of forming a storage cell capacitor on a substrate having a node, comprises the steps of forming a reaction barrier layer over the node; forming a conductive layer over the reaction barrier layer; dry etching the conductive layer using a mask; wet etching the conductive layer using the same mask to form a storage node electrode; dry etching the reaction barrier layer; forming recesses at both sidewalls of the reaction barrier layer and beneath the storage node electrode; and forming an oxidation barrier spacer on the recesses.

According to another aspect of the invention, a method of forming a storage cell capacitor on a substrate having a node, comprises the steps of forming a first insulating layer on the substrate, the first insulating layer having a first opening on the node; forming a contact plug in the first opening; forming a recess on the contact plug and in the first opening; forming a reaction barrier layer in the recess and, lateral sides of the reaction barrier layer being surrounded by the first insulating layer; forming a second insulating layer over the first insulating layer, the second insulating layer having a second opening on the reaction barrier layer; forming a conductive layer over the second insulating layer filling up the second opening; dry etching the conductive layer using a mask to etch an upper portion of the conductive layer; and wet etching the conductive layer usinig the same mask to form a storage node electrode.

BRIEF DESCRIPTION OF THE DRAWINGS

This invention may be understood and its objects will become apparent to those skilled in the art by reference to the accompanying drawings as follows.

DETAILED DESCRIPTION OF PREFERRED EMBODIMENTS

The present invention will be described with reference to sample preferred embodiments, but it must be recognized that the present invention can be widely modified and varied, and the scope of the present invention is not limited except as set forth in the accompanying claims.

Embodiment 1

FIG. 4A through FIG. 4D are cross-sectional views showing the processing steps of a novel method of forming a storage cell capacitor in accordance with a first embodiment of the invention.

Figure 1A:
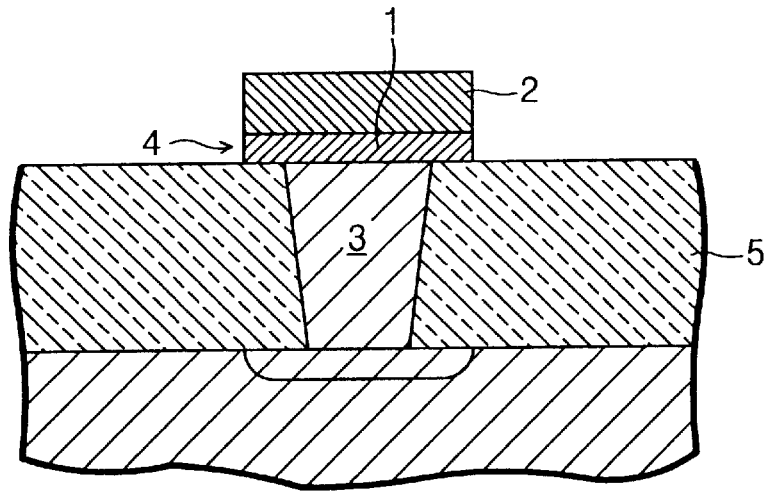
FIGS. 1A and 1B are cross-sectional views showing processing steps of a prior art method of forming a capacitor.
Figure 1B:
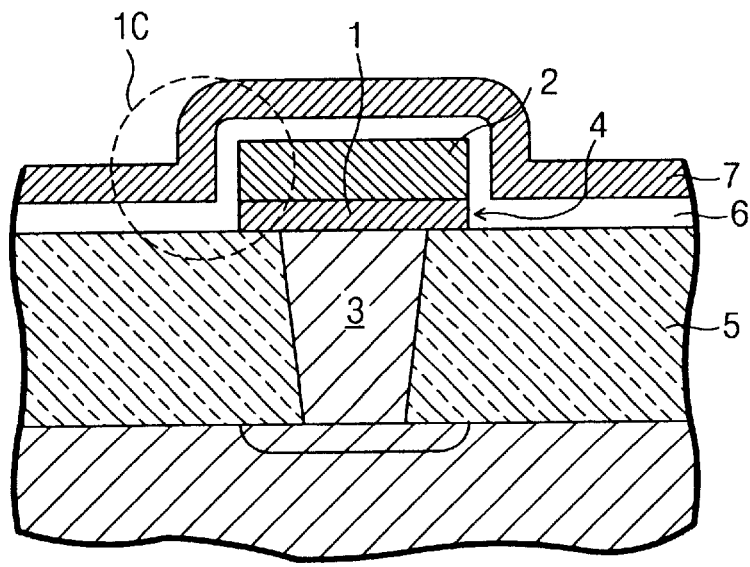
Figure 1C:
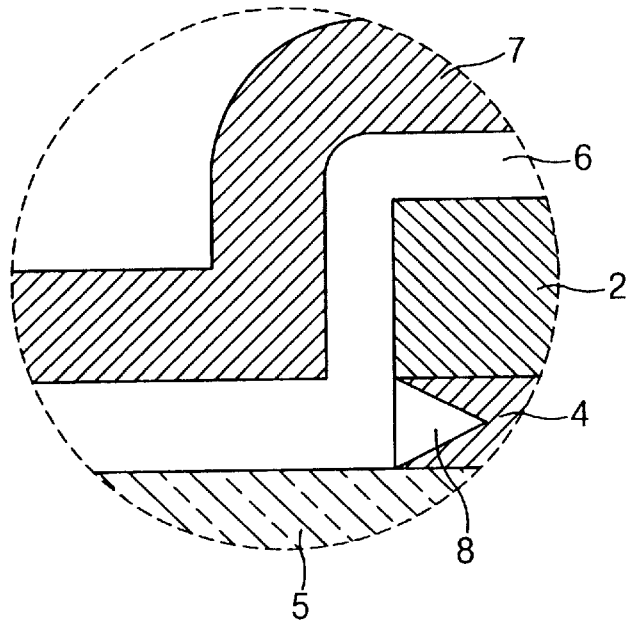
FIG. 1C is an enlarged view of the area indicated by a dotted circle of FIG. 1B.
Figure 2:
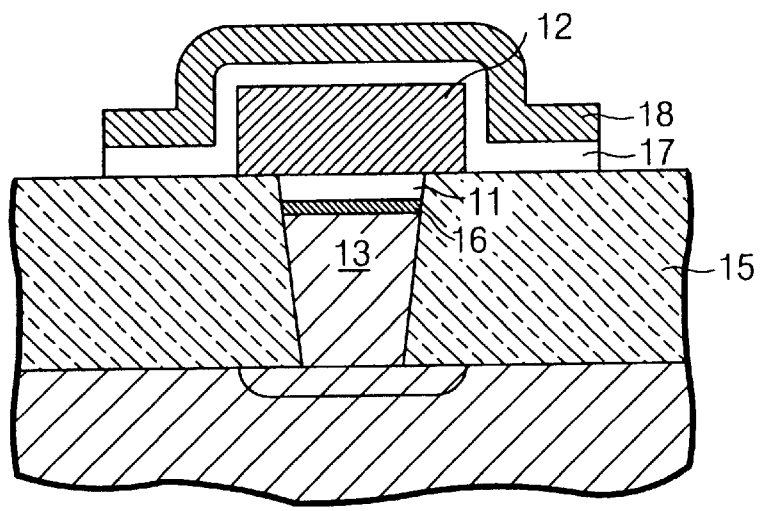
FIG. 2 is a cross sectional view showing a capacitor fabricated according to another prior art method of forming a capacitor.
Figure 3A:
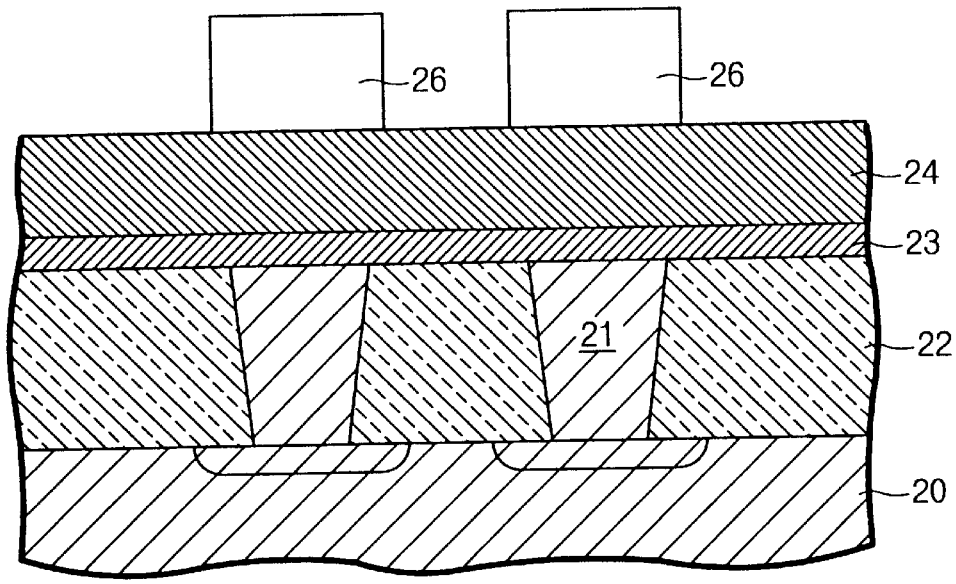
FIGS. 3A to 3C are cross-sectional views showing processing steps of another prior art method of forming a capacitor.
Figure 3B:
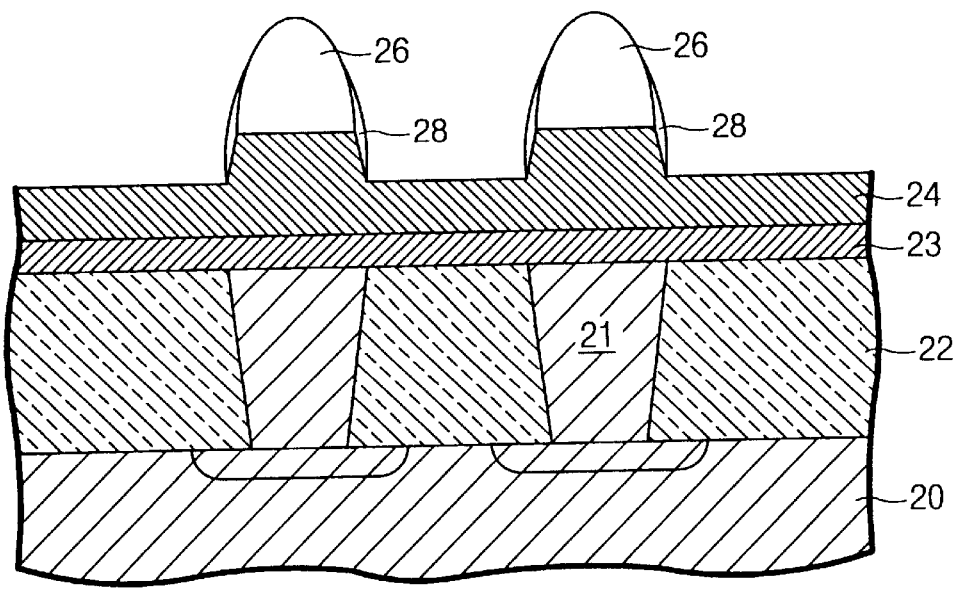
Figure 3C:
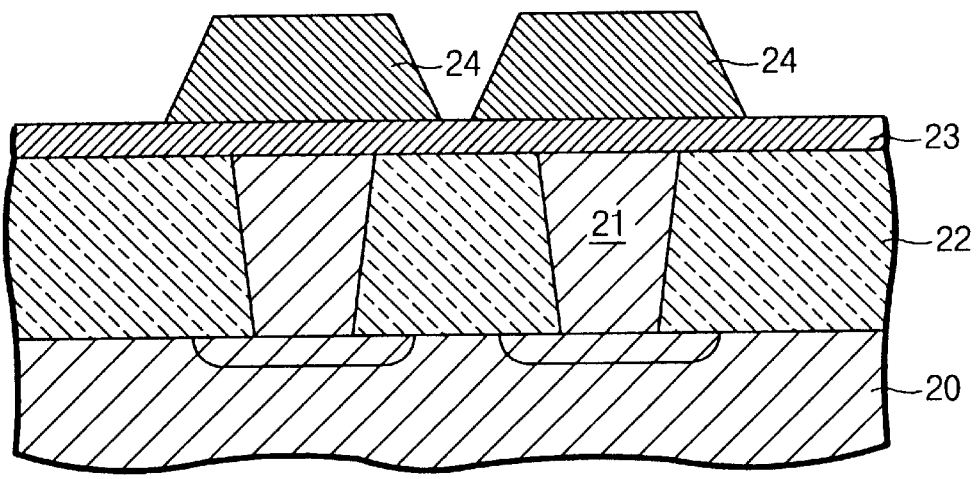
Figure 4A:
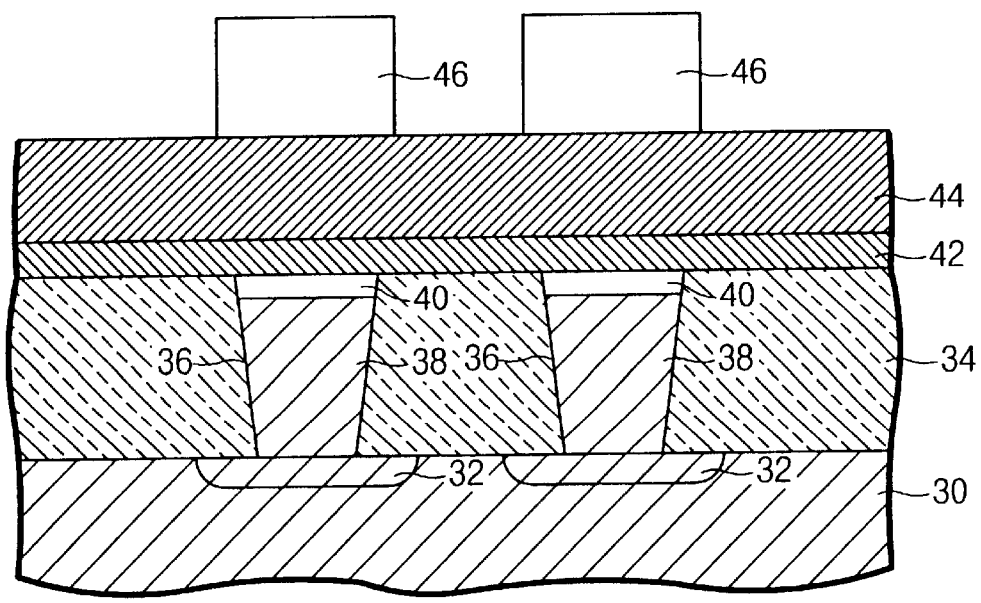
FIG. 4A through FIG. 4D are cross-sectional views showing the processing steps of a novel method of forming a storage cell capacitor in accordance with a first embodiment of the invention.
Figure 4B:
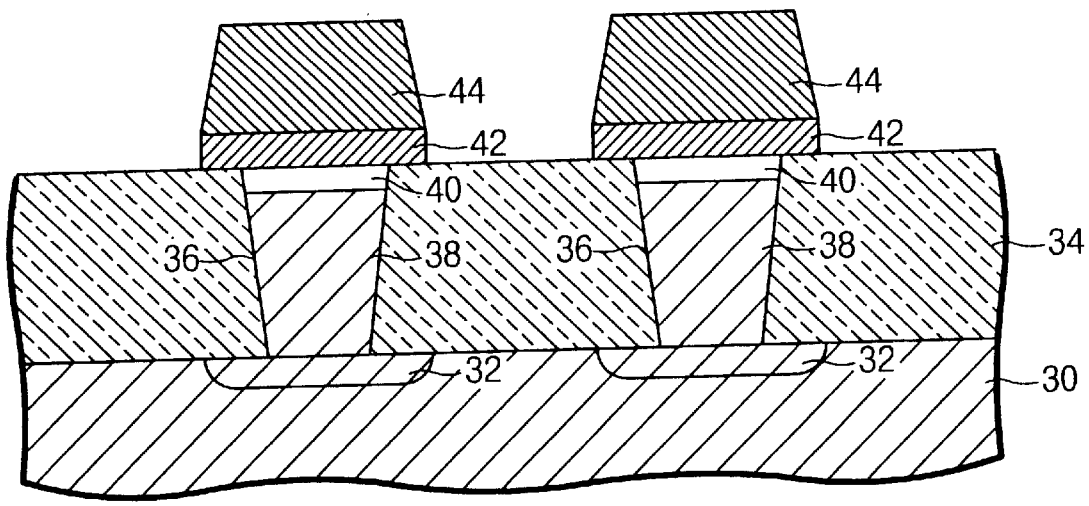
Figure 4C:
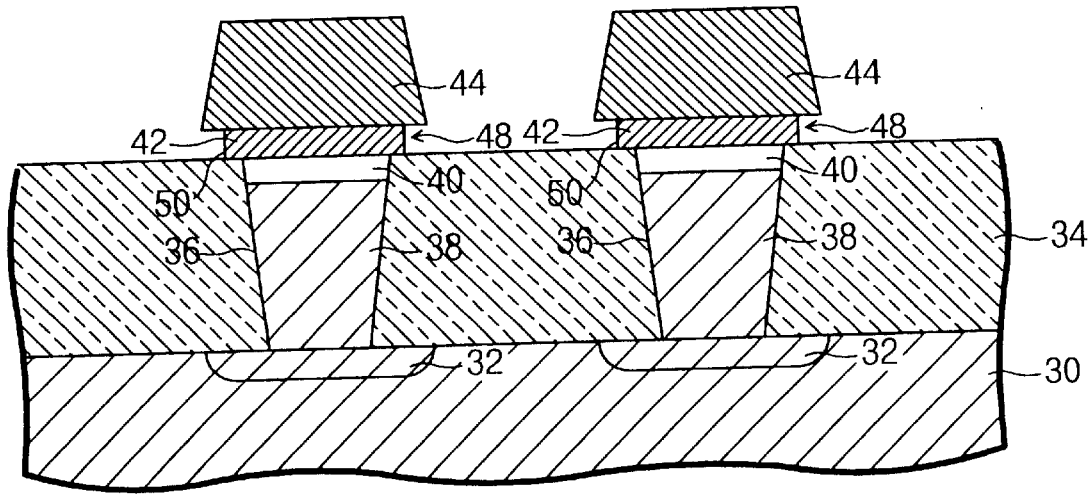
Figure 4D:
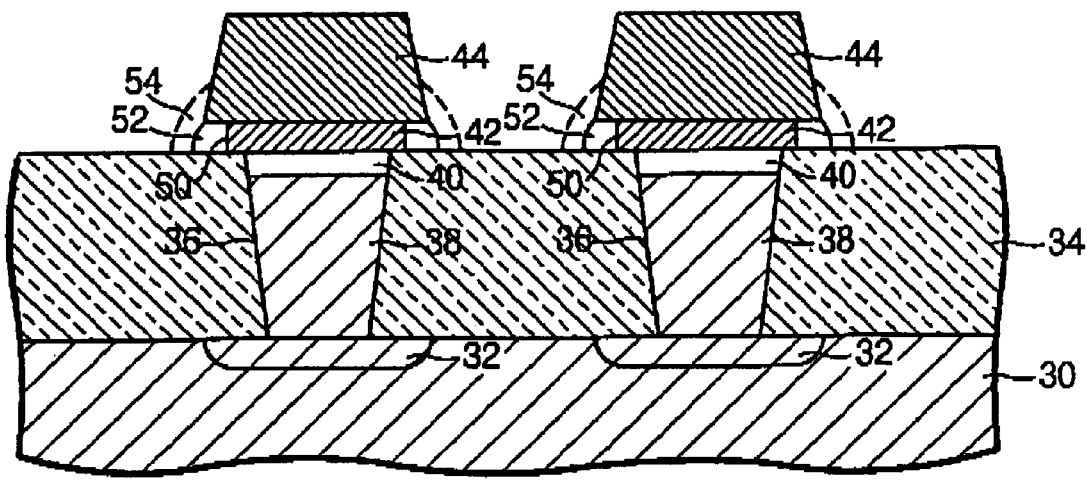

Referring to FIGS. 4C and 4D, a novel method of forming a capacitor according to a first embodiment of the invention is shown. After sequentially depositing a reaction barrier layer 42 and a platinum layer 44 overlying a contact plug 38, which is formed on a semiconductor substrate, the reaction barrier layer 42 is wet etched to form recesses 48 in reaction barrier layer 42, beneath the platinum layer 44. Sidewall spacers 52 are formed on the recesses and beneath the platinum layer 44. During deposition of a high dielectric material or subsequent anneal steps, lateral sides of the reaction barrier layer 42, with the sidewall spacers resistant to oxidation, can be prevented from being oxidized. In addition to preventing oxidation of the reaction barrier layer, the present invention method has an advantage in that the platinum layer 44 is formed directly on the reaction barrier layer 42 without additional process steps.

Referring to FIG. 4A, a semiconductor wafer structure is comprised of a bulk substrate 30 having a conductively doped diffusion region 32. A planarized layer 34 of an insulating material, such as borophosphosilicate glass (BPSG), is provided on the substrate 30. A contact opening 36 is formed through the insulating layer 34 to the diffusion region 32. The contact opening 36 is filled with an electrically conductive material, preferably polysilicon, and thereby a contact plug 38 is formed. The contact plug 38 constitutes a node to which electrical connection to a capacitor is to be made. A silicide layer 40 is formed on top of the contact plug 38 so as to reduce contact resistance. The silicide layer 40 is substantially formed by etching part of the contact plug 38 to form a recess in the plug and depositing a silicide material on the recess. An electrically conductive reaction barrier layer 42 is provided on top of the planarized insulating layer 34. The reaction barrier layer 42 is made of one selected from a group which consists of TiN, TaN, TiSiN, TaSiN, TiAlN, TaAlN, and combinations thereof. Also, a layer 44 of electrically conductive material is deposited on the reaction barrier layer 42 to form a storage node electrode. A preferred material for the storage node 44 is platinum (Pt). In this embodiment, the reaction barrier layer 42 is made of, preferably, TiN. Although the silicide layer 40 is formed between the contact plug 38 and the reaction barrier layer 42, as shown in FIGS. 4A to 4D, the reaction barrier layer 42 may be formed directly on the contact plug 38 without an intervening silicide layer.

With reference to FIG. 4B, the platinum and reaction barrier layers 44 and 42 are sequentially dry etched using a storage node forming mask 46, shown in FIG. 4A, such as photoresist pattern, so that a storage node electrode is formed. Since the platinum layer 44 is resistant to oxidation, it provides an excellent surface for the subsequent deposition of the high dielectric constant material, e,g., BST. Also, the platinum layer 44 protects the top surface of the titanium nitride layer 42 from strong oxidizing conditions during the subsequent BST deposition.

As a variation of the embodiment, the platinum layer 44 may have a steeply-sloped pattern of more than 80° inclination angle by two continuous etching steps: dry etch and wet etch. In detail, a dry etch is performed to etch an upper portion of the platinum layer 44 and then a wet etch, using a chemical such as HCl/HNO$_3$ solution, or HCl/HNO$_3$ diluted in a deionized water, is performed to etch a lower portion thereof. Although not shown in the figures, during the dry etch, some sputtered platinum particles adhere to the sidewalls of the mask layer 46 (referring to FIG. 4A) to form a residue on the sidewalls thereof. Thus, the bottom of the mask layer 46 is slightly in excess of the critical dimension, and the top portion of the mask layer 46 is rounded during the dry etch. During the wet etch, the longitudinal etch speed of the platinum layer 44 can be increased faster than the lateral etch speed thereof by controlling the rate of HCl and HNO$_3$. With these continuous etching processes, the platinum layer 44 is patterned to have an angle of inclination of 80 degrees or more with respect to the planarized surface of the oxide layer 34. The platinum patterns formed thus can be electrically sufficiently separated from each other. Details of the immediately above mentioned variation for patterning the platinum layer 44 will be described in a second embodiment illustrated in FIG. 6K.

FIGS. 4C and 4D show the concept of the first embodiment of the present invention. In FIG. 4C, after removal of the mask, the reaction barrier layer 42 is also wet etched using a wet etching chemical to form lateral recesses 48 beneath the platinum layer 44. Ideally, the wet etching step is to produce the recesses 48 positions lateral sides 50 of barrier layer 42 laterally outward from the node defined by the contact plug 38. The wet etching chemical for producing the recesses 48 where the reaction barrier layer 42 comprises TiN may be a first chemical solution which mixes H$_2$O$_2$ as an oxidizer, HF and deionized water, or a second chemical solution which mixes H$_2$O$_2$, NH$_4$OH and deionized water. In the first or second chemical solution, concentration of H$_2$O$_2$ is in the range of 1 wt % to 36 wt %, and concentration of the HF is in the range of 50%. H$_2$O$_2$ and HF of the first chemical solution is in the ratio of 300:1 to 50:1, and H$_2$O$_2$ and NH$_4$OH of the second chemical solution is in the ratio of 1:10 to 10:1. When the first chemical solution is used, the wet etching step is performed at a temperature of 20° C. to 70° C. for 30 seconds to 10 minutes. Alternatively, when the second chemical solution is used, the wet etching step is preformed at a temperature of 20° C. to 70° C. for 30 seconds to 20 minutes.

If the reaction barrier layer comprises TiSiN formed by sputtering Ti$_x$Si$_y$ target, the TiSiN layer exists as a mixture which contains a little Si$_3$N$_4$ and Si on TiN film. Thus, TiN phase of the reaction barrier layer is etched by H$_2$O$_2$ of the respective chemical solution, while Si$_3$N$_4$ and Si phases of the TiSiN layer are etched by HF of the first chemical solution or NH$_4$OH of the second chemical solution.

Figure 5:
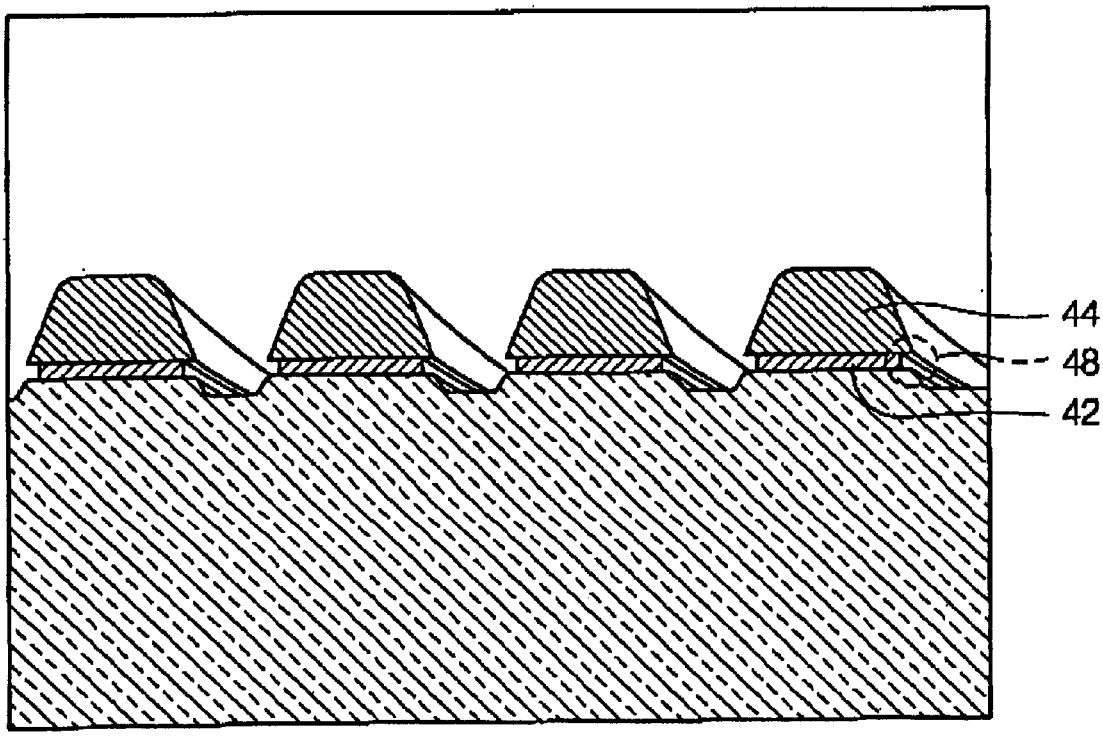
FIG. 5 is a scanning electron microphotograph (SEM) that illustrates a perspective view of the storage node electrode of the storage cell capacitor manufactured according to the first embodiment of the invention.

FIG. 5 is a scanning electron microphotograph (SEM) that illustrates a perspective view of the storage node electrode of the storage cell capacitor manufactured according to the first embodiment of the invention.

Here, a wet etching process for the reaction barrier layer 42 of TiSiN is carried out using a wet etching chemical including H$_2$O$_2$ of 7 wt % to 8 wt % and HF of 50% at a 200:1 rate, at a temperature of 20° C. for 3 minutes. As a result, as is apparent from FIG. 5, the reaction barrier layer 42 of TiSiN beneath the storage node electrode 44 is wet etched to about 20 Angstroms to have lateral recesses 48.

Turning to FIG. 4D, an insulator layer of oxide is deposited over the semiconductor substrate, filling up the recesses 48 of the reaction barrier layer 42, and is then etched back to form insulator spacers 52 on the lateral recesses 48 beneath the storage node electrode 44. Process margin for the etch back can be increased due to the recessed structure formed beneath the storage node electrode 44 of platinum. Also, almost all the storage node electrode 44 can be exposed, and therefore the insulator spacer 52 completely covers the lateral sides of the reaction barrier layer, and is formed immediately beneath the platinum layer 44. This increases the effective area of the completed storage cell capacitor. Herein, even if the deposited insulator layer is over-etched during formation of the insulator spacer 52, no part of the reaction barrier layer 42 is exposed due to the under-cut profile of the storage node electrode.

If the step of forming the insulator spacer is carried out without forming the lateral recesses of the reaction barrier layer (e.g., without forming an under-cut profile of the storage node electrode) as in the prior art, it is difficult to accurately etch back an insulator material deposited for producing the spacer in order that the insulator spacer can be formed only on the lateral recesses. As an example, if an undesired pattern of the insulator spacer is formed as shown by a dotted line 54 of FIG. 4D, the effective area of the storage cell capacitor formed thus is decreased as compared with that of the storage cell capacitor with the under-cut profile of the storage node electrode. Also, if the deposited insulator layer is dry over-etched to form the insulator spacer, part of the reaction barrier layer is susceptible to oxidation.

Subsequently, the process continues by conventional methods to complete the storage cell capacitor. As an example, although not shown in figures, a high dielectric layer such as BST, PZT etc. is deposited over the semiconductor substrate to form a capacitor dielectric layer and then a conductive layer formed of a conductive material, such as platinum, is deposited on the capacitor dielectric layer thereby completing the storage cell capacitor.

According to the above mentioned embodiment, oxidation of reaction barrier layer can be minimized owing to sidewall spacers, which are formed on lateral recesses of the reaction barrier layer, during the deposition of the high dielectric layer or subsequent annealing steps.

Embodiment 2

Figure 6A:
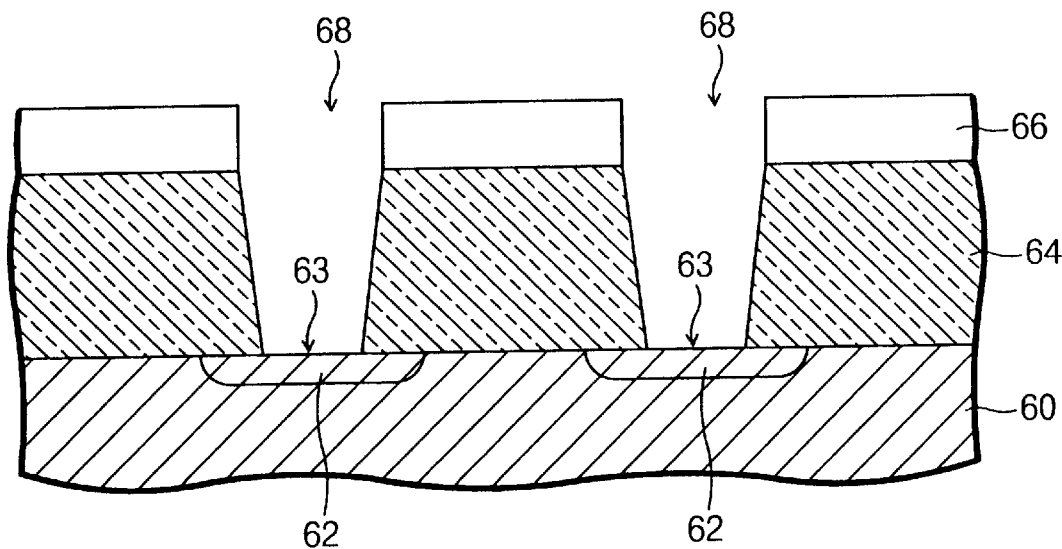
FIGS. 6A to 6L are cross-sectional views showing the processing steps of a novel method of forming a storage cell capacitor in accordance with a second embodiment of the invention.
Figure 6B:
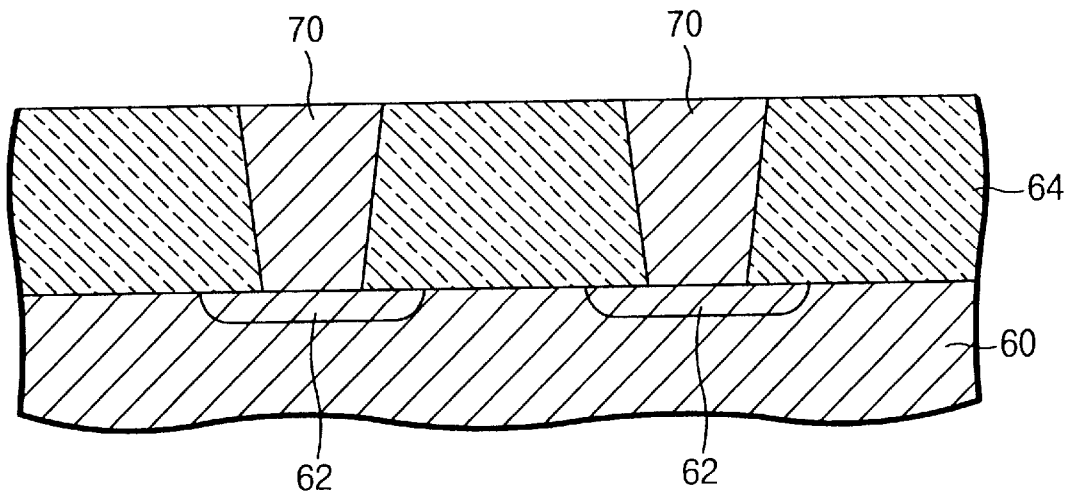
Figure 6C:
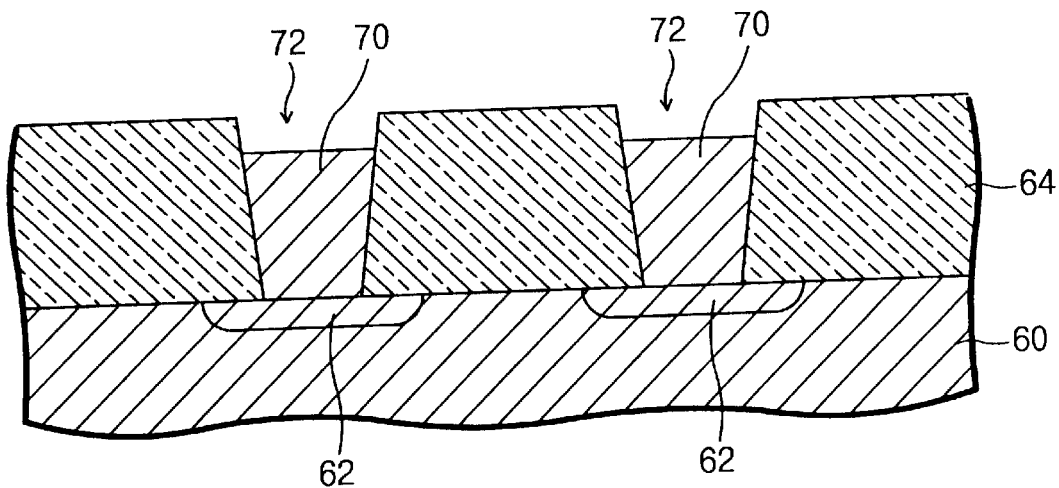
Figure 6D:
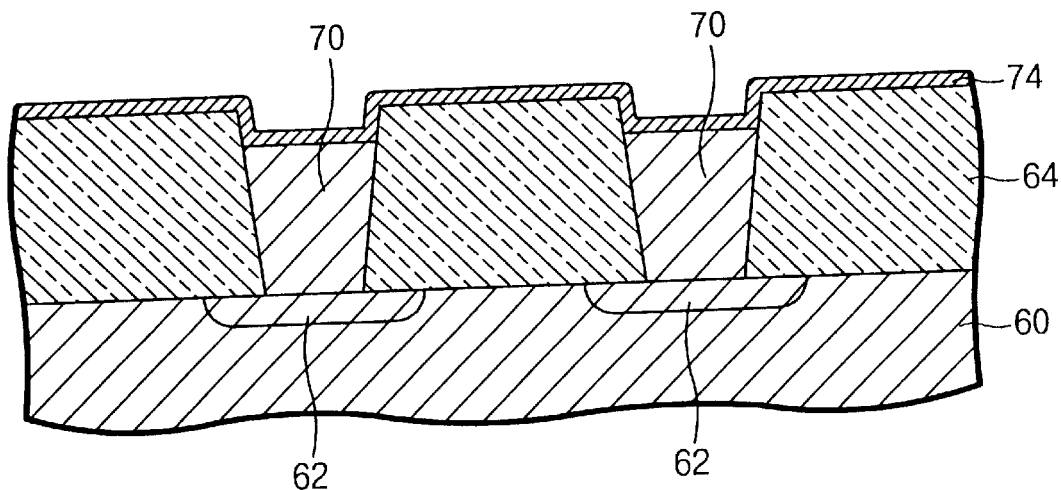
Figure 6E:
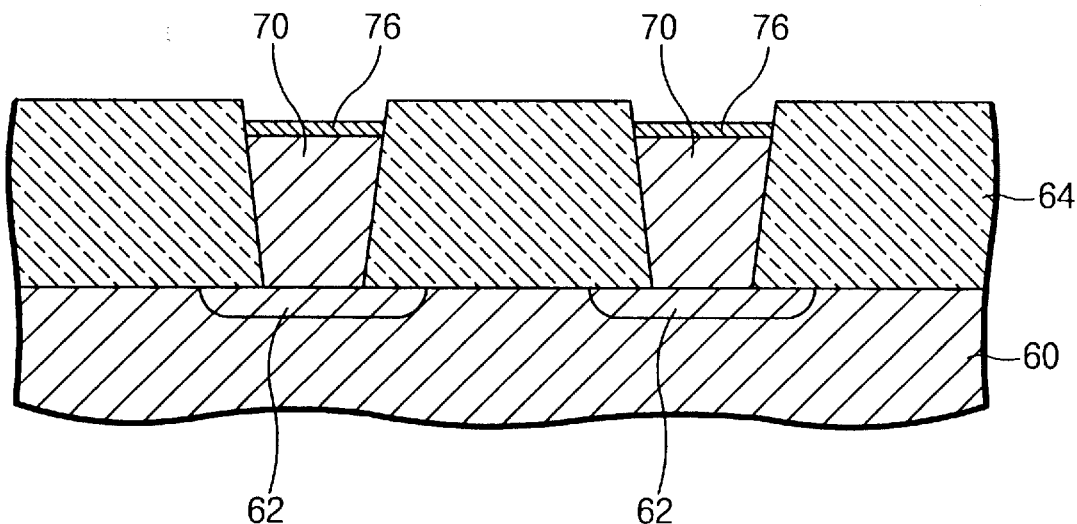
Figure 6F:
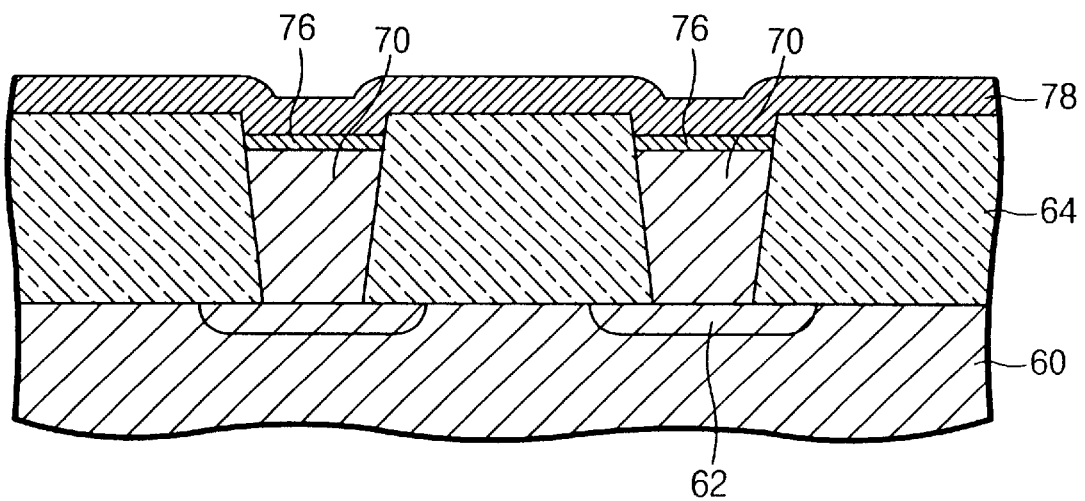
Figure 6G:
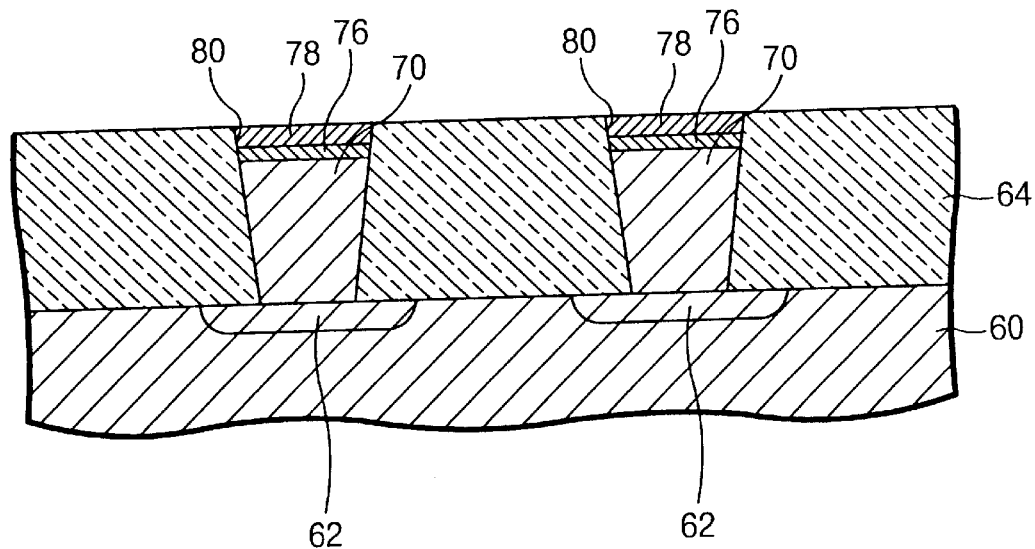
Figure 6H:
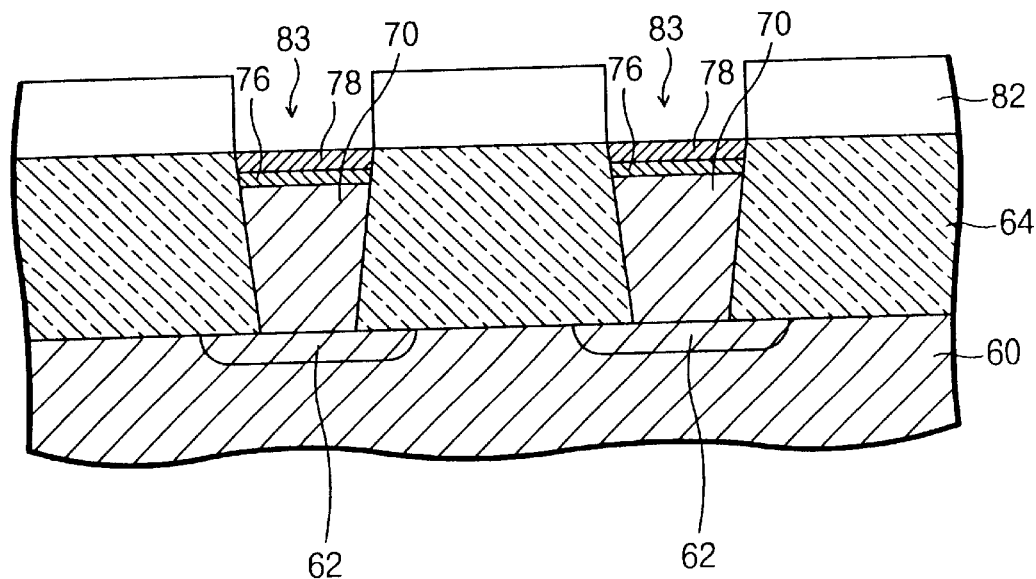

FIGS. 6A through 6L are cross-sectional views showing the processing steps of a novel method of forming a storage cell capacitor in accordance with a second embodiment of the invention. A novel method of forming a capacitor according to a second embodiment of the invention is defined by two important features. One is to surround sidewalls of a reaction barrier layer 78 with an oxide layer 64 as shown in FIG. 6H, and the other is to form a platinum layer 84, serving as a storage node electrode of a capacitor, having an inclined plane of more than 80 degrees. The reaction barrier layer 78 is formed in a recess overlying polysilicon plug 70 and surrounded by the oxide layer 64, thereby preventing the storage node electrode from being oxidized during a BST deposition or a subsequent anneal. Also, an upper portion of the platinum layer 84 has a steeply-sloped pattern of more than 80° inclination angle, formed by two continuous etching steps, one is a dry etch for partially etching the upper portion of the platinum layer 84 and the other is a wet etch for etching the rest of the upper portion thereof. As a result, the platinum patterns can be electrically separated from each other.

Referring to FIG. 6A, mask 66 defines self-aligned substrate contact area 63. An oxide layer 64 is etched, preferably dry etched, to form a contact opening 68 exposing the contact areas 63 of the bulk substrate 60 having conductively doped diffusion regions 62.

Referring to FIG. 6B, in order to provide electrical connection between the substrate 60 and the storage cell capacitor contact plugs 70 of, for example, polysilicon are formed in the contact openings 68. In order to form polysilicon plugs 70, two methods are mainly employed. One is a selective silicon growth from the contact area 63. The other is an in-situ doped polysilicon deposition and a subsequent etch back or CMP back.

Referring now to FIG. 6C, an upper portion of the polysilicon plug 62 is removed during a dry etch in order to form a recess 72. In a case where the polysilicon plug 70 is formed during a selective silicon growth, it is possible to form recess 72 by controlling the growth.

Referring now to FIG. 6D, a first barrier layer of titanium 74 is deposited to overlie the oxide layer 64 and polysilicon plug 70. A thermal anneal is performed and the titanium 74 in contact with the polysilicon plug 70 reacts with the polysilicon to form a titanium silicide layer 76. The titanium which is not in contact with the polysilicon plug 70 reacts with the nitrogen to form TiN. In addition, a thin nitride layer is formed to overlie titanium silicide 76.

Referring not to FIG. 6E, the unsilicided layer (the unreacted titanium in the case of a non-nitrogen anneal, or the TiN, in the case of a nitrogen anneal) and the thin nitride layer have been removed during a wet etch. The titanium silicide 76 overlying the polysilicon plug 70 is retained during etching.

Referring to FIG. 6F, a second barrier layer 78 of titanium nitride is formed by a chemical vapor deposition (CVD) or a sputtering process performed at room temperature. In this embodiment, shown in FIG. 6F, the titanium nitride layer 78 has a thickness nearly equal to the depth of recess 72 remaining after the removal of the unreacted titanium. The titanium silicide layer 76 is provided to lower a contact resistance between the polysilicon plug 70 and the titanium nitride layer 78. The titanium nitride layer 78 functions as a reaction barrier layer against silicon diffusion of the polysilicon plug 70 and the titanium silicide layer 76 during subsequent high temperature anneals.

Referring to FIG. 6G, the titanium nitride layer 78 of FIG. 6F, is planarized, preferably by CMP, in order to expose at least the oxide layer 64 and in order to retain titanium nitride 78 in the recess 72 overlying the titanium silicide 76. Portions of the oxide layer 64 may be planarized during this step. It is important, of course, to retain a sufficient depth of the titanium nitride 78 in order to inhibit silicon diffusion. It can be seen that only the upper surface of the titanium nitride layer 78 is exposed and that the titanium nitride sidewalls 80 are protected by the oxide layer 64.

Referring to FIG. 6H, an insulating layer 82 such as an oxide material is deposited on the oxide layer 64 as well as the titanium nitride layer 78, and patterned to form an opening 83 and expose the top surface of the titanium nitride layer 78.

Figure 6I:
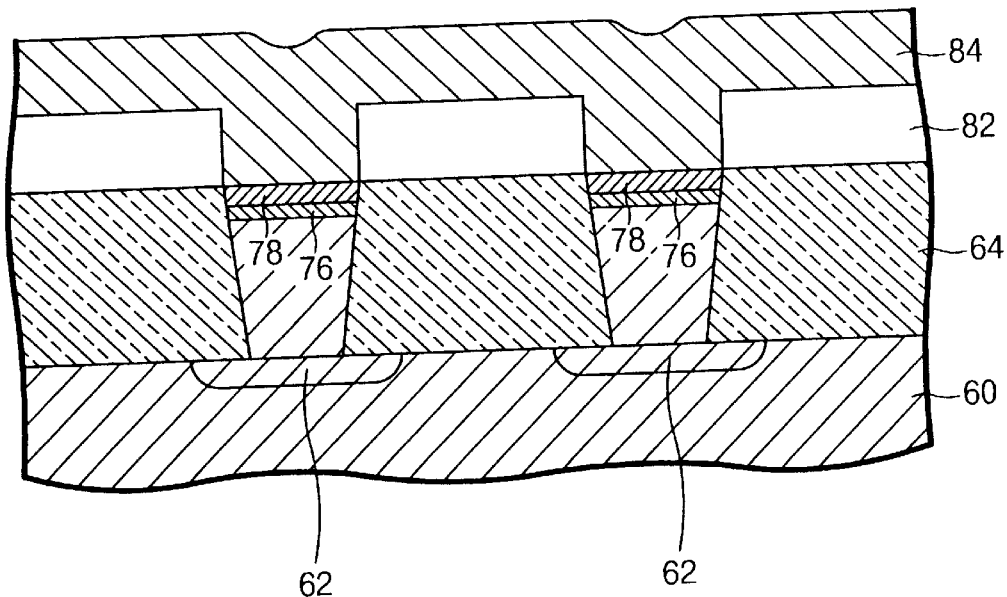

Referring to FIG. 6I, a platinum layer 84 is formed at room temperature by CVD (chemical vapor deposition), sputtering or electroplating technique. The platinum layer 84 overlies the titanium nitride layer 78 as shown in FIG. 6H, and has a thickness in the range of 1000 to 2000 angstroms. Since the platinum layer 84 is resistant to oxidation, it provides an excellent surface for the deposition of the high dielectric constant material. In addition, the platinum layer 84 protects the top surface of the titanium nitride layer 78 from strong oxidizing conditions during the BST deposition. Therefore, platinum is used as a capacitor electrode since it will not oxidize during a BST deposition or subsequent anneals. An electrode that oxidizes would have a low dielectric constant film below the BST, thereby negating the advantages provided by the high dielectric constant material. The titanium nitride layer 78 is introduced to avoid Si and Pt inter-diffusion of atoms, thereby preventing the formation of $SiO_2$ on top surface of the platinum electrode.

Since the titanium nitride layer 78 is recessed in the oxide layer 64, a thick layer of platinum may be deposited without decreasing the density of the device. By using very thick platinum electrodes, the capacitance area is increased by the sidewall area contribution.

Figure 6J:
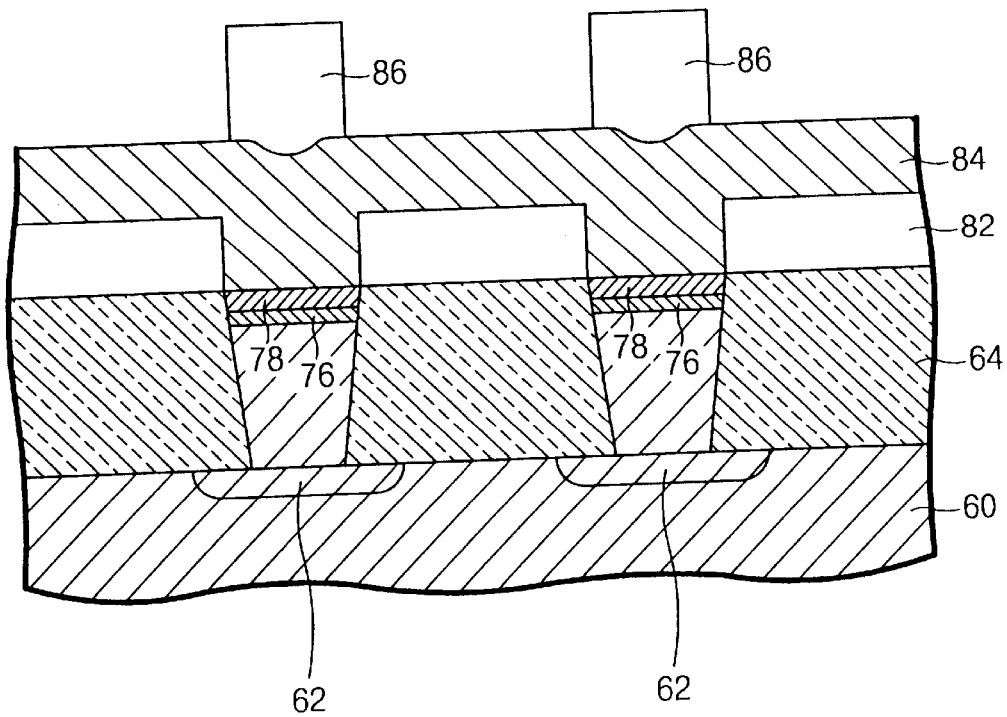

Referring to FIG. 6J, a mask layer 86 is formed on the platinum layer 84 overlying the titanium nitride layer 78 to define a storage node electrode of the storage cell capacitor. The mask layer 86 is made of one selected from a group which consists of oxide, nitride, TiN, $TiO_2$, TiSiN and TiAlN. The step of forming mask layer 86 may be performed, after the top surface of the platinum layer 84 is planarized by CMP. In this embodiment, the mask layer 86 is formed directly on the platinum layer 84 without performing CMP.

Figure 6K:
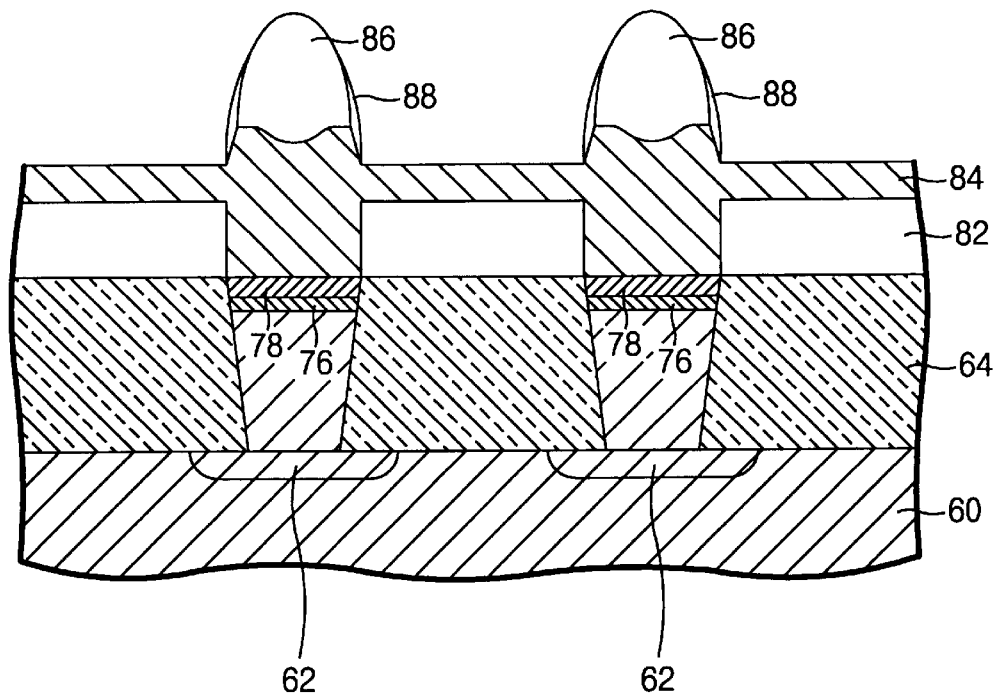

FIG. 6K illustrates the partial removal of unmasked portions of the platinum layer 84. In FIG. 6K, the unmasked portions of the platinum layer 84 are etched to a depth of between 200 and 500 angstroms by a dry etching process using the mask layer 86. This dry etching process is performed for sixty seconds or less. During the dry etching process, part of sputtered platinum particles is adhered to sidewalls of the mask layer 86 to form a residue 88 on the sidewalls thereof. The bottom of the mask layer 86 is slightly in excess of the critical dimension. Also, top portion of the mask layer 86 is rounded during the dry etching process. With this dry etching process, part of the platinum layer 85 is patterned to form part of an upper portion (shown by a reference numeral 84b in FIG. 6L) thereof having the angle of inclination of 80 degrees or more with respect to the planarized surface of the oxide layer 64.

Figure 6L:
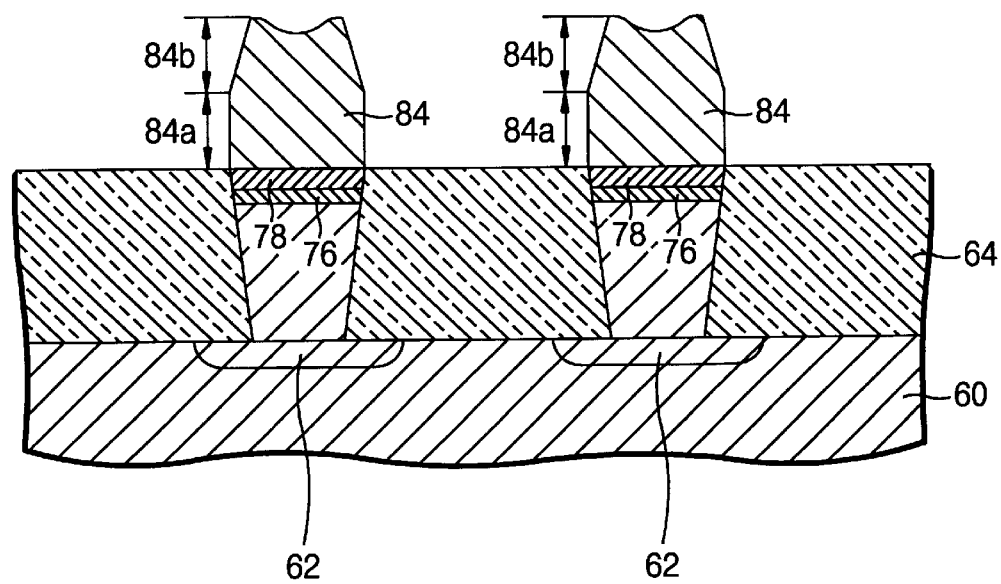

Referring now to FIG. 6L, the unmasked portions of the platinum layer 84 shown in FIG. 6K are wet etched by using the same mask 86 until the oxide layer 64 is exposed, to form the completed upper portion of the platinum layer 84. The unmasked platinum is removed during the wet etching process using a chemical such as $HCl/HNO_3$ solution, or $HCl/HNO_3$ diluted in a deionized water. The longitudinal etch speed of the platinum layer 84 can be increased faster than the lateral etch speed thereof by controlling the rate of HCl and $HNO_3$. In this embodiment, the chemical for the wet etching process comprises $HCl/HNO_3$ at a 3 to 15 rate and a deionized water of 0 to 80% with respect to total amount, at a temperature of 40 to 100° C. Typically, the storage node electrode is thought of as comprising the titanium nitride layer 78 and the platinum layer 84. The polysilicon plug 70 is often thought of as an electrical interconnect interposed between the substrate and the storage node electrode, although it can be thought of as a portion of the storage node itself. Subsequently the mask 86 and the oxide layer 64 are removed to complete a storage node electrode of the storage cell capacitor.

Alternatively, after formation of the platinum storage node electrode, the platinum layer 84 may also be dry etched to smooth the surface thereof.

As can be seen in FIG. 6L, a lower portion 84a of the platinum layer 84 has a nearly perpendicular profile with respect to the planarized surface of the oxide layer 64, and the upper portion 84b thereof has an inclined profile of more than about 80 degrees in angle of inclination with respect to the planarized surface of the oxide layer 64. Since the lower portion 84a of the platinum layer 84 is patterned in accordance with a damascene process using the oxide layer 64, it can have a desired pattern with vertical sides.

Next, the process continues by conventional methods to complete the storage cell capacitor. As an example, although not shown in figures, a high dielectric layer such as BST, PZT etc. is deposited over the semiconductor substrate to form a capacitor dielectric layer and then a conductive layer is deposited on the capacitor dielectric layer to form an upper capacitor electrode. In the embodiment BST is used as the preferred material. As a result, the storage cell capacitor is completed.

According to the above mentioned embodiment, the titanium nitride layer 78 is not oxidized during the deposition of BST or subsequent anneals because oxide layer 64 protects sidewalls 80 of the titanium nitride layer 78 from an exposure to an oxidizing atmosphere and platinum layer 84 protects the upper surface of titanium nitride layer 78, as shown in FIG. 6I.

Also, the lower portion 84a of the platinum layer 84 is formed by a damascene process to have an inclined plane of nearly 90 degrees, and the upper portion thereof is formed by continuous dry and wet etching processes to have an inclined plane of more than nearly 80 degrees, refer to FIGS. 6K and 6L. Therefore, since patterns of the platinum layer are steeply-sloped and can be electrically separated from adjacent patterns, the method according to the invention can be particularly suitable to fabrication of highly integrated semiconductor devices.

What is claimed is:

1. A method of forming a storage cell capacitor on a substrate having a node, comprising the steps of:

forming a reaction barrier layer over the node;

forming a conductive layer over the reaction barrier layer;

sequentially dry etching the conductive layer and the reaction barrier layer to form a storage node electrode;

wet etching the reaction barrier layer, thereby recessing the lateral sides of the reaction barrier layer with respect to the conductive layer;

forming an oxidation barrier layer over the conductive layer and the reaction barrier layer; and dry etching the oxidation barrier layer to form an oxidation barrier spacer on the recessed lateral sides of the reaction barrier layer wherein the reaction barrier layer is made of a material selected from the group consisting of TiN, TaN, TiSiN, TaSiN, TiAlN, TaAlN, and combinations.

2. The method according to claim 1, wherein the wet etching step is performed using a chemical that includes $H_2O_2$, HF and deionized water.

3. The method according to claim 2, wherein the wet etching step is performed at a temperature of 20° C. to 70° C. for 30 seconds to 10 minutes.

4. The method according to claim 1, wherein the wet etching step is performed using a chemical that includes $H_2O_2$, $NH_4OH$ and deionized water.

5. The method according to claim 4, wherein the wet etching step is performed at a temperature of 20° C. to 70° C. for 30 seconds to 20 minutes.

6. A method of forming a storage cell capacitor having a node on a substrate, comprising the steps of:

forming a reaction barrier layer over the node;

forming a conductive layer over the reaction barrier layer;

dry etching the conductive layer using a mask;

after the dry etching, wet etching the conductive layer using the same mask to form a storage node electrode;

forming recesses at sidewalls of the reaction barrier layer and underneath edges of the storage node electrode; and forming an oxidation barrier spacer in the recesses.

7. The method according to claim 6, wherein said wet etching step is performed using a chemical that includes HCl/HNO$_3$ solution or HCl/HNO$_3$ diluted in a deionized water.

8. The method according to claim 6, further comprising, after the wet etching of the conductive layer, patterning the reaction barrier layer.

9. A method of forming a storage cell capacitor having a node on a substrate, comprising the steps of:

forming a first insulating layer on the substrate, the first insulating layer having a first opening overlying the node;

forming a contact plug in the first opening;

forming a recess on the contact plug within the first opening;

forming a reaction barrier layer in the recess so that sidewalls of the reaction barrier layer are surrounded by the first insulating layer;

forming a second insulating layer over the first insulating layer, the second insulating layer having a second opening overlying the reaction barrier layer;

forming a conductive layer over the second insulating layer filling up the second opening;

dry etching the conductive layer using a mask to etch an upper portion of the conductive layer; and after the dry etching, wet etching the conductive layer using the same mask to form a storage node electrode.

10. The method according to claim 9, wherein said mask is made of a material selected from a group consisting of oxide, nitride, TiN, TiO$_2$, TiSiN and TiAlN.

11. The method according to claim 9, wherein the drying etching step is performed for sixty seconds or less.

12. The method according to claim 9, wherein the wet etching step is performed using a chemical comprised of HCl/HNO$_3$ at a ratio selected from the range of ratios 3:1 to 15:1, and deionized water of 0 to 80% with respect to total amount, at a temperature of 40° C. to 100° C.

13. The method according to claim 9, further comprising, after the wet etching of the conductive layer, removing the second insulating layer.

* * * * *